US009853504B2

(12) United States Patent
Neidorff (10) Patent No.: US 9,853,504 B2
(45) Date of Patent: Dec. 26, 2017

(54) DATA EXTRACTION THRESHOLD CIRCUIT AND METHOD

(71) Applicant: Texas Instruments Incorporated, Dallas, TX (US)

(72) Inventor: Robert A. Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 573 days.

(21) Appl. No.: 14/501,850

(22) Filed: Sep. 30, 2014

(65) Prior Publication Data

US 2015/0171634 A1 Jun. 18, 2015

Related U.S. Application Data

(60) Provisional application No. 61/916,655, filed on Dec. 16, 2013, provisional application No. 61/916,669, (Continued)

(51) Int. Cl.
| | |
|---|---|
| *H02J 5/00* | (2016.01) |
| *H02J 50/10* | (2016.01) |
| *H03K 19/20* | (2006.01) |
| *H04B 5/02* | (2006.01) |
| *H02J 7/02* | (2016.01) |
| *H02J 50/80* | (2016.01) |
| *H03K 5/1532* | (2006.01) |
| *H03K 5/1536* | (2006.01) |
| *H03K 5/24* | (2006.01) |

(Continued)

(52) U.S. Cl.
CPC ............. *H02J 50/10* (2016.02); *H02J 5/005* (2013.01); *H02J 7/025* (2013.01); *H02J 50/80* (2016.02); *H03K 5/1532* (2013.01); *H03K 5/1536* (2013.01); *H03K 5/24* (2013.01); *H03K 19/20* (2013.01); *H04B 5/0093* (2013.01); *H04B 5/02* (2013.01); *H03K 2005/00078* (2013.01); *H04B 5/0031* (2013.01); *H04B 5/0037* (2013.01)

(58) Field of Classification Search
CPC ..................................................... H02J 50/10
USPC .......................................................... 307/104
See application file for complete search history.

(56) References Cited

U.S. PATENT DOCUMENTS

| | | | |
|---|---|---|---|
| 5,504,485 A | 4/1996 | Landt et al. | |
| 5,614,851 A * | 3/1997 | Holzer | ................... G01R 19/04 327/50 |

(Continued)

OTHER PUBLICATIONS

U.S. Appl. No. 14/502,285, filed Sep. 30, 2014 (21 pages).
U.S. Appl. No. 15/174,601, filed Jun. 6, 2016 (27 pages).

*Primary Examiner* — Joseph Chang
(74) *Attorney, Agent, or Firm* — Lawrence J. Bassuk; Charles A. Brill; Frank D. Cimino (57) ABSTRACT

A circuit for setting a threshold level for extracting data from a signal stream includes a terminal couplable to the signal stream. A peak detector is coupled to the terminal. A valley detector is coupled to the terminal. A comparator is coupled to outputs of the peak detector and the valley detector for generating a threshold voltage for extracting data or commands from the signal stream. A method of extracting data from a signal stream including: peak detecting the signal stream to generate a first signal; valley detecting the signal stream to generate a second signal; combining the first and second signals to generate a threshold signal; and extracting data from the signal stream utilizing the threshold level signal.

13 Claims, 7 Drawing Sheets

Related U.S. Application Data filed on Dec. 16, 2013, provisional application No. 61/916,643, filed on Dec. 16, 2013.

(51) Int. Cl.
  *H04B 5/00* (2006.01)
  *H03K 5/00* (2006.01)

(56) References Cited

U.S. PATENT DOCUMENTS

| | | |
|---|---|---|
| 8,179,088 B2 | 5/2012 | Takaishi et al. |
| 8,669,678 B2 | 3/2014 | Urano |
| 9,041,254 B2 | 5/2015 | Lisuwandi et al. |
| 9,112,364 B2 | 8/2015 | Partovi |
| 9,362,755 B2 * | 6/2016 | Khandelwal ............ H02J 5/005 |
| 9,362,756 B2 | 6/2016 | Khandelwal et al. |
| 2002/0057584 A1 * | 5/2002 | Brockmann ............ H02J 7/025 |
| | | 363/98 |
| 2009/0174263 A1 * | 7/2009 | Baarman ................ H02J 5/005 |
| | | 307/104 |
| 2012/0022613 A1 | 1/2012 | Meskens |
| 2012/0212068 A1 | 8/2012 | Urano |
| 2014/0097791 A1 * | 4/2014 | Lisuwandi ............. H01F 38/14 |
| | | 320/108 |
| 2014/0106826 A1 | 4/2014 | Yeo et al. |
| 2014/0191568 A1 | 7/2014 | Partovi |
| 2014/0368050 A1 | 12/2014 | Chun et al. |
| 2015/0108847 A1 | 4/2015 | Taylor et al. |
| 2016/0094278 A1 | 3/2016 | Khandelwal et al. |
| 2016/0352146 A1 | 12/2016 | Khandelwal et al. |

\* cited by examiner

DATA EXTRACTION THRESHOLD CIRCUIT AND METHOD

CROSS-REFERENCE TO RELATED APPLICATIONS

This application claims the benefit of U.S. Provisional Patent Application No. 61/916,655; Provisional Patent Application No. 61/916,669 filed Dec. 16, 2013; and U.S. Provisional Patent Application No. 61/916,643 filed on Dec. 16, 2013, which are incorporated herein by reference in its entirety and for all purposes. This application is also related to U.S. patent application Ser. No. 14/502,378, filed Sep. 30, 2014, now U.S. Pat. No. 9,362,756, issued Jun. 7, 2016; U.S. patent application Ser. No. 14/502,048, filed Sep. 30, 2014, now U.S. Pat. No. 9,362,755, issued Jun. 7, 2016; and U.S. patent application Ser. No. 14/502,285, filed Sep. 30, 2014, filed on even date, which are incorporated herein by reference in their entireties and for all purposes.

FIELD

The invention relates to extracting data or commands from a noisy signal and, more particularly, to a circuit for setting a threshold voltage level for extracting the data or commands.

BACKGROUND

Extracting data or commands from a noisy signal is a difficult task. Noisy data can occur when data is transmitted on a long cable or a radio link. Another situation in which data needs to be extracted from a noisy signal occurs in wireless power transmission. The term "wireless power" as utilized herein refers to the transmission of electrical energy from a power source to an electrical load without interconnecting wires. A common form of wireless power transmission utilizes two electromagnetically coupled coils to form a transformer through which power is transferred from the transmitting side to the receiving side. The transmitter may take the form of a pad having a coil embedded therein. The receiver may be built into a cellular telephone, for example, with a receiving side coil built into the back thereof. Although there is no direct contact between the transmitting and receiving coils, the close proximity of the coils and a judicious use of shielding allows for efficient transfer of energy from the transmitting side to the receiving side to operate a load, which may be a rechargeable battery being recharged through the system, for example.

Figure 1:
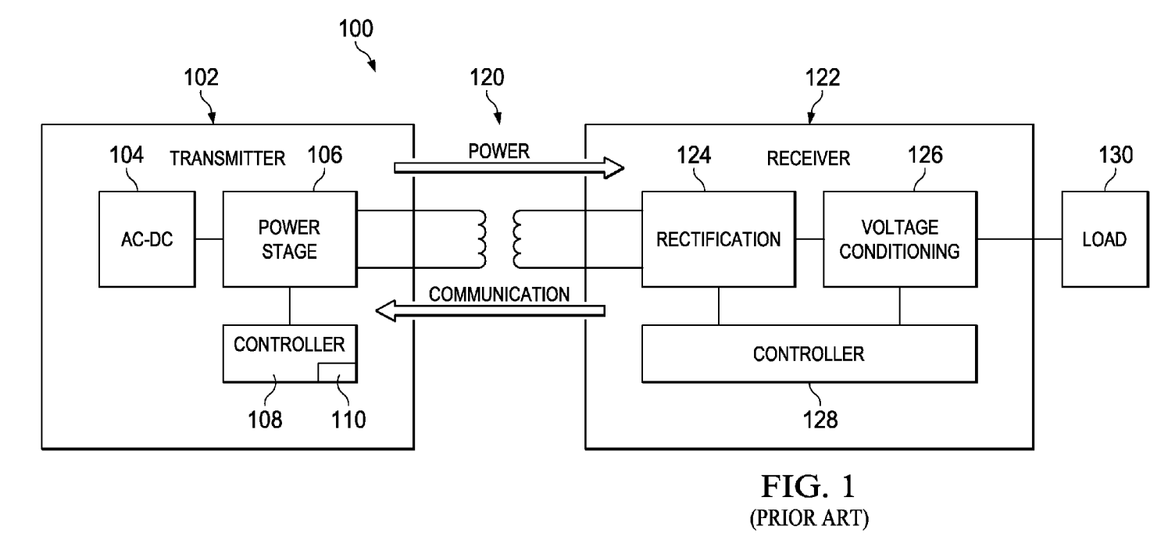
FIG. 1 is a diagram of a wireless power system according to the prior art.

FIG. 1 shows a block diagram of a prior art wireless power transmission system, generally as 100. The system comprises a transmitter side 102 and a receiver side 122. The transmitter side 102 comprises a circuit 104 for rectifying an AC input into a DC voltage which is fed into a power stage 106 for generating a high frequency signal. The high frequency signal is coupled across a transformer 120 to the receiver side 122. The power stage 106 is controlled by a controller 108 which contains a threshold setting circuit 110. The threshold setting circuit 110 could be external to the controller 108. The power stage 106 and the controller 108 could be combined into a single integrated circuit. The receiver side 122 comprises a rectifier circuit 124 to output a DC voltage to a voltage conditioning circuit 126 which is operated by the receiving controller 128 to supply power to a load 130, which may be a rechargeable battery being recharged by the system, for example.

As shown in FIG. 1, power flows from left to right from the transmitter to the receiver and communications flow from right to left from the receiver to the transmitter. The communication signals may be command signals to adjust the power level from the transmitter or other parameters, for example. The communication signals may be generated by coupling a resistor or capacitor across the receiving coil to generate signals which can be recognized by the controller on the transmitting side. These low level signals are noisy because of the noise generated by the power transmission portion of the system.

Figure 2:
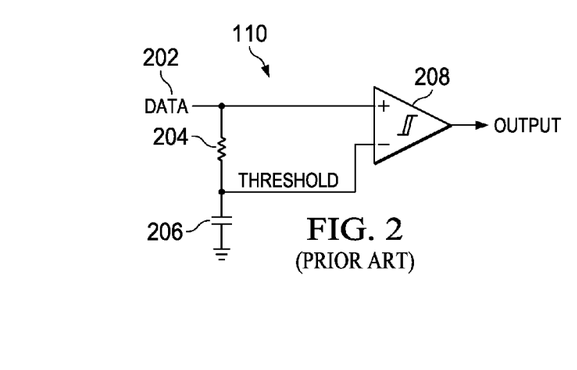
FIG. 2 is a schematic of an RC threshold detection circuit in accordance with the prior art.
Figure 3:
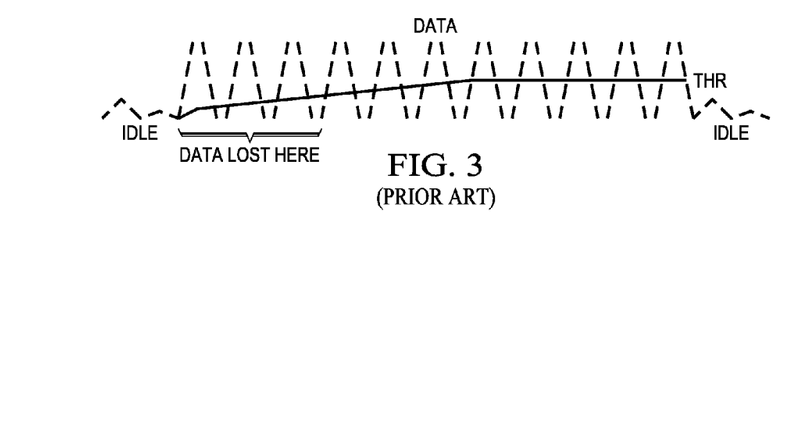
FIG. 3 shows the signal output of the circuit FIG. 2.
Figure 4:
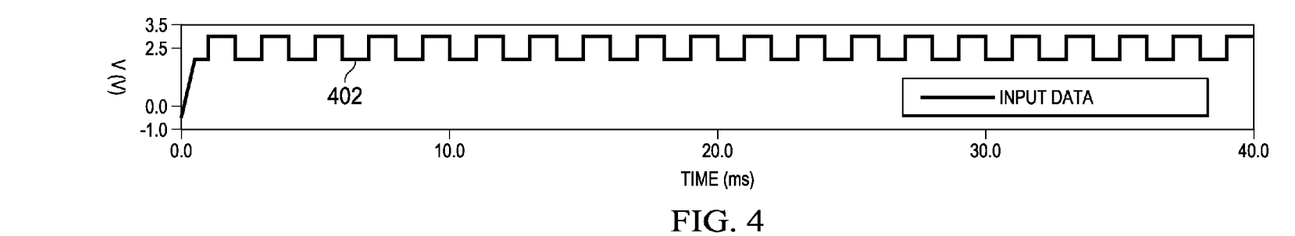
FIG. 4 shows the data input to the circuits of FIGS. 2, 8 and 12.
Figure 5:
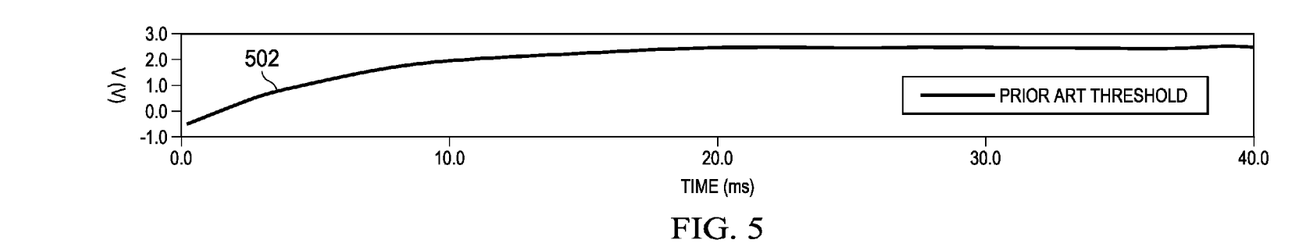
FIG. 5 shows the threshold signal of the prior art RC threshold detection circuit.
Figure 6:
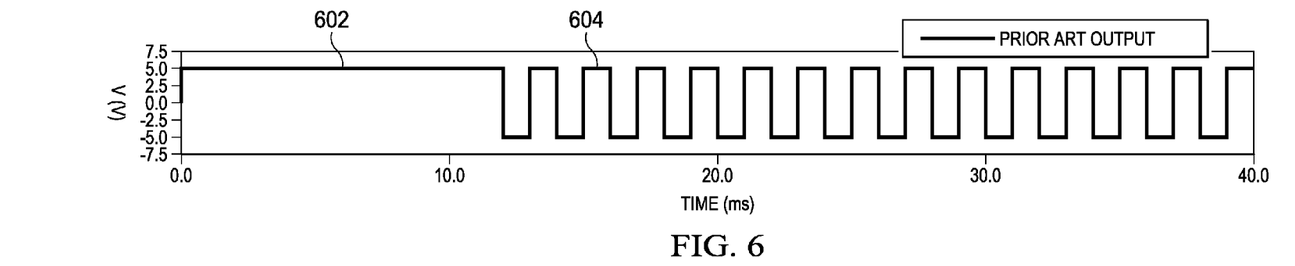
FIG. 6 shows the output of the prior art circuit shown in FIG. 2.

FIG. 2 shows a prior art circuit for setting a voltage threshold level for extracting the data or commands from this noisy signal, generally as 110. The data or command signals are applied at terminal 202 and charge the capacitor 206 via resistor 204. A comparator 208 receives this threshold voltage and utilizes it to extract the data from a noisy signal, as is well known in the art. A problem with the circuit as illustrated in FIG. 3, is that the data or commands in wireless power transmission systems trends occur at intervals, so that the voltage across capacitor 206 is lost. Therefore, every time data is sent, the capacitor must be recharged before the appropriate threshold is generated. This is shown in FIG. 3 where data transmission starts after idle and the threshold signal Thr starts charging with the first data pulse. The threshold does not reach a value allowing the data to be retrieved until several pulses have passed. Thus, data in those first pulses is lost. This is illustrated in greater detail in FIGS. 4, 5 and 6. In these figures, the axis is time in milliseconds and the ordinate is volts. FIG. 4 illustrates the incoming data 402. FIG. 5 illustrates the charging of the threshold generating capacitor at 502 and FIG. 6 shows the data loss 602 from the pulses 604. A typical circuit might have a resistor of 30 mega ohms and a capacitor of 200 pF, for example. Increasing the size of the capacitor or resistor would reduce the charge lost when the circuit is at idle, but having large capacitors or resistors on a chip requires a large area on the chip and having external components increases the cost and size of the circuit.

Another known technique for extracting the threshold value is to utilize an ADC circuit driving a microprocessor and extracting the data utilizing a software routine (not shown). This is an expensive solution.

Thus, there is the need for a low cost, highly integratable threshold circuit that reaches its full threshold value quickly so that no data is lost.

SUMMARY

It is a general object to provide full recovery of data or command signals from a noisy signal stream.

In an aspect, a circuit for setting a threshold level for extracting data from a signal stream comprises a terminal couplable to the signal stream. A peak detector is coupled to the terminal. A valley detector is coupled to the terminal. The peak detector output and valley detector output are combined to generate a threshold. A comparator is coupled to the threshold voltage for extracting data or commands from the signal stream.

In an aspect, a method of extracting data from a signal stream comprises peak detecting the signal stream to generate a first signal. Valley detecting the signal stream to generate a second signal. Combining the first and second signals to generate a threshold signal. Extracting data from the signal stream utilizing the threshold level signal.

In an aspect, in a primary side wireless power transmitter for being inductively coupled to a secondary side wireless power receiver for supplying power to the wireless power receiver to power a load coupled to the wireless power receiver, a primary side controller for receiving communications from the secondary side wireless power receiver through the inductive coupling comprises a peak detector receiving a signal stream from the secondary side wireless power receiver. A valley detector receiving a signal stream from the secondary side wireless power receiver. A comparator coupled to the threshold voltage for extracting data or commands from the signal stream.

In an aspect, a method of operating a primary side wireless power transmitter inductively coupled to a secondary side wireless power receiver for supplying power to the wireless power receiver to power a load coupled to the receiver comprises peak detecting a signal stream from the wireless power receiver to generate a first signal. Valley detecting the signal stream to generate a second signal. Generating a threshold voltage signal from the first and second signals. Extracting data from the signal stream utilizing the threshold voltage signal.

BRIEF DESCRIPTION OF DRAWINGS

Further aspects of the invention will appear from the appending claims and from the following detailed description given with reference to the appending drawings.

DETAILED DESCRIPTION

Figure 7:
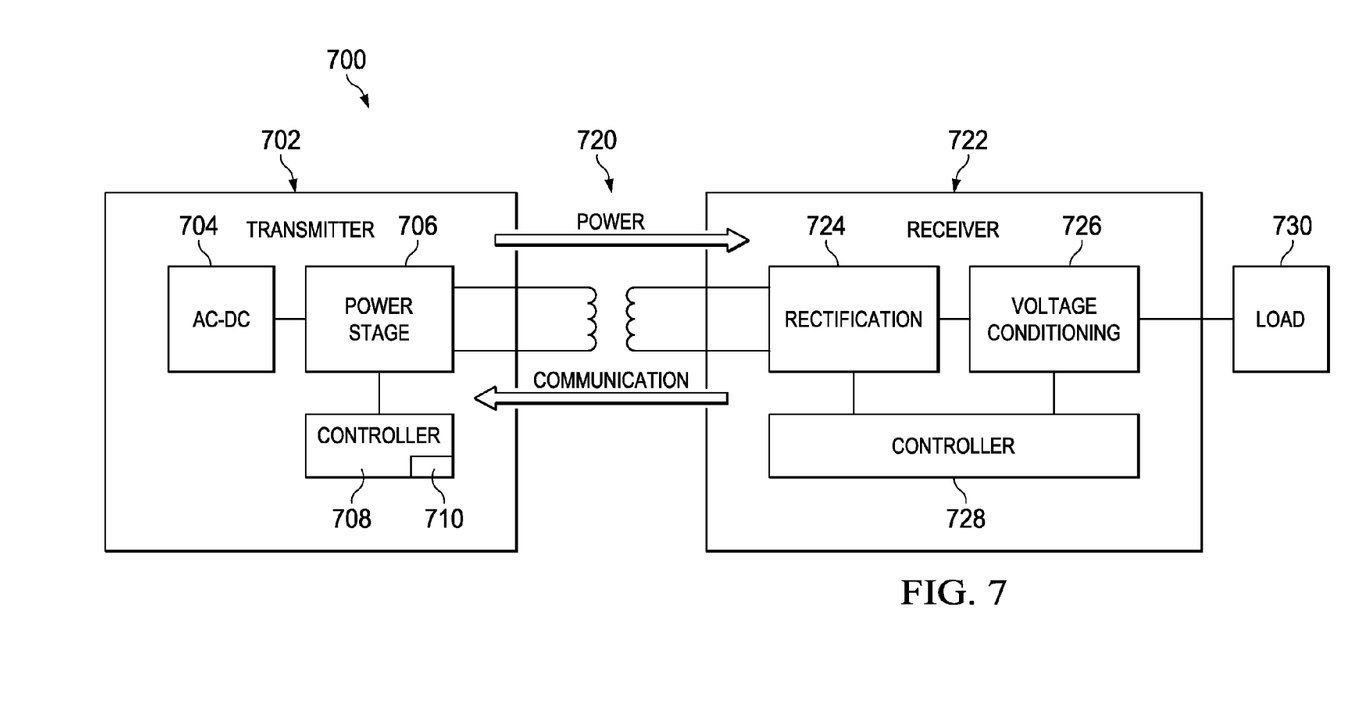
FIG. 7 shows an embodiment constructed according to the principles of the present disclosure.

FIG. 7 shows an embodiment, generally as 700. The embodiment 700 is generally similar to the circuit shown in FIG. 1, with the exception of the threshold setting device 710. In the embodiment 700, the transmitter side 702 comprises a circuit 704 for rectifying an AC input into a DC voltage which is fed into a power stage 706 for generating a high frequency signal which is coupled across a transformer 720 to the receiver side 722. The power stage 706 is controlled by a controller 708 which contains a threshold setting circuit 710. The threshold setting circuit 710 is different from the RC circuit 110 in FIG. 1 and is replaced by a peak/valley detector circuit in accordance with one aspect constructed according to the principles of the present disclosure, which will be explained in greater detail hereinafter. The receiver side 722 comprises a rectifier circuit 724 to output a DC voltage to a voltage conditioning circuit 726 which is operated by the receiving side controller 728 to supply power to a load 730, which may be a rechargeable battery being recharged by the system, for example.

Figure 8:
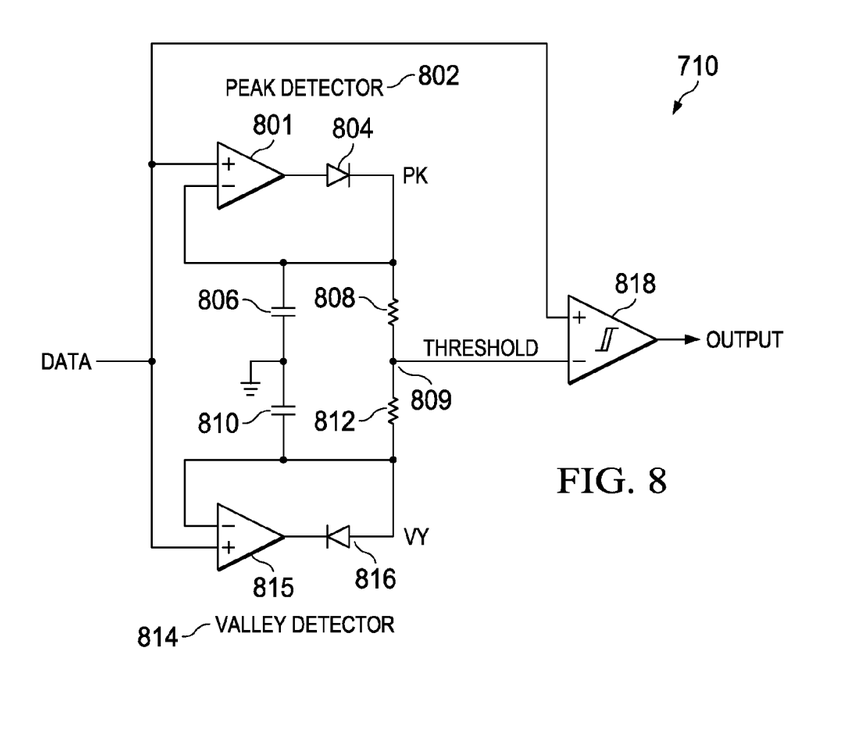
FIG. 8 shows the peak/valley detector of the embodiment of FIG. 7.

FIG. 8 shows the peak/valley detector circuit 710 in greater detail. Peak detector 802 and valley detector 814 are coupled to receive the data (or command) signal stream. The data (or command) signal is coupled to the non-inverting input of amplifier 801 in peak detector circuit 802 and to the non-inverting input of amplifier 815 of valley detector circuit 814. The output of the peak detector 802 is coupled through diode 804 to the inverting input thereof. A capacitor 806 is coupled between the inverting input of the amplifier 801 and a reference voltage, represented by ground. The output of amplifier 815 is coupled through diode 816 to the inverting input thereof. The inverting input is also coupled via capacitor 810 to the reference potential represented by ground. A pair of resistors 808 and 812 are coupled in series between the inverting input to the amplifier 801 and inverting input to the amplifier 815. A node 809 is at the junction of the two resistors. Node 809 is coupled to the inverting input of comparator 818, the non-inverting input of which is coupled to receive the data. The recovered data is at the output of the comparator 818. This circuit allows smaller capacitors and resistors to be used, for example, a 100 pF capacitor with 5 mega ohm resistors.

Figure 9:
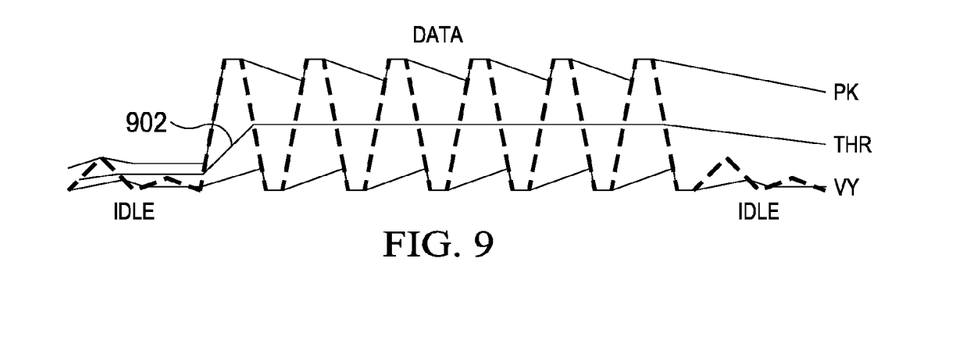
FIG. 9 shows the data output of the circuit of FIG. 8.

FIG. 9 shows the recovered data between the two idle states as well as the outputs of the peak detector and valley detector where the signal PK is at the output of the peak detector 802 after the diode 804 in FIG. 8 and the signal VY is at the output of the valley detector 814 after the diode 816 in FIG. 8. The threshold generated at node 809 is shown as the signal Thr in FIG. 9. The threshold signal Thr is shown as rapidly increasing at 902. It should be noted that when no data signal is present, the RC circuits are isolated by diodes 804 and 816 and the capacitors 806 and 810 will discharge to the idle level of the data through the resistors 808 and 812.

Figure 10:
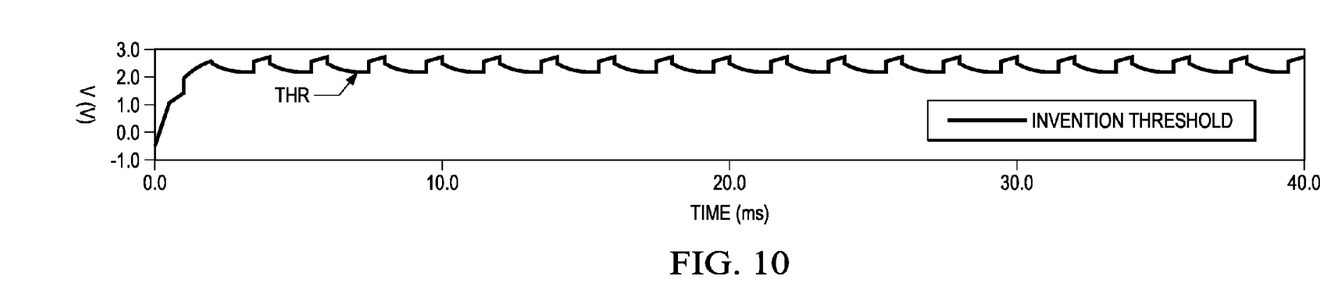
FIG. 10 shows the threshold signal of the circuit of FIG. 8.
Figure 11:
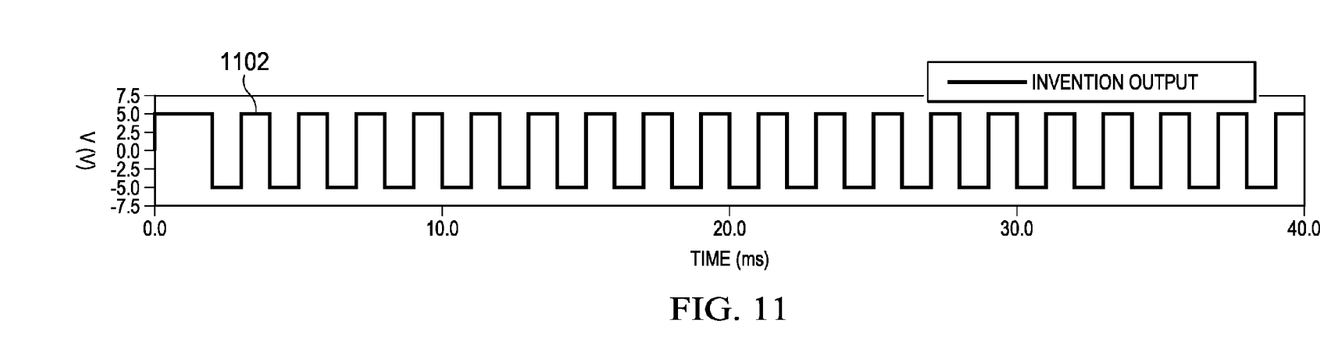
FIG. 11 shows the data output of the circuit shown FIG. 8.

FIG. 10 shows the threshold voltage Thr generated by the embodiments of FIG. 8 and shown in FIG. 9 in greater detail. FIG. 11 shows the recovered data at the output of comparator 818. Even though the threshold voltage shown in FIG. 10 is not as smooth as the threshold voltage 502 shown in FIG. 5, no data is lost, as can be seen by comparing signals 1102 of FIG. 11 and 402 of FIG. 4.

Figure 12:
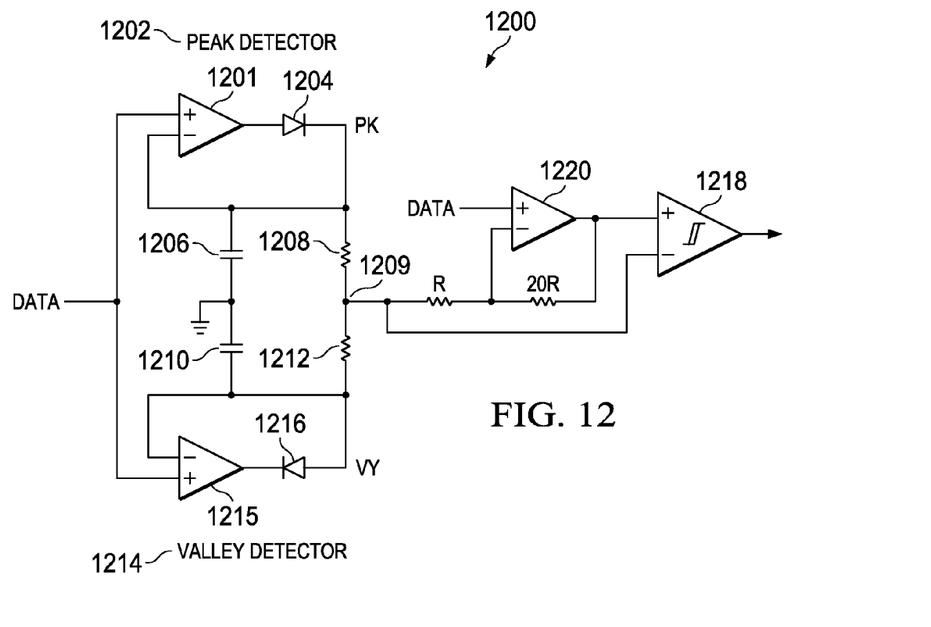
FIG. 12 shows an alternate embodiment constructed according to the principles of the present disclosure.

A second embodiment is shown in FIG. 12 generally as 1200. In FIG. 12, peak detector 1202 and valley detector 1214 are coupled to receive the data (or command) signal stream. In FIG. 12, the data (or command) signal is coupled to the non-inverting input of amplifier 1201 and to the non-inverting input of amplifier 1215. The output of the amplifier 1201 is coupled through diode 1204 to the inverting input thereof. A capacitor 1206 is coupled between the inverting input to amplifier 1201 and a reference voltage, represented by ground. The output of amplifier 1215 is coupled through diode 1216 to the inverting input thereof. The inverting input is also coupled via capacitor 1210 to a reference voltage represented by ground. A pair of resistors 1208 and 1212 are coupled in series between the inverting input to the peak detector 1202 and the inverting input to the valley detector 1214. A node 1209 is at the junction of the two resistors. Node 1209 is coupled to the inverting input of comparator 1218. In this embodiment, a preamplifier 1220 is coupled to receive the data at a non-inverting input thereof.

The threshold signal at node 1209 is coupled via resistor R to the inverting input of the preamplifier 1220. The output of the preamplifier 1220 is coupled through a resistor 20R of the preamplifier 1220. This establishes the preamplifier as a high gain amplifier. The output of preamplifier 1220 is coupled to the non-inverting input of comparator 1218. This circuit allows smaller capacitors and resistors to be used, for example, a 100 pF capacitor and resistors with 5 mega ohm resistors. The recovered data appears at the output of comparator 1218.

Figure 13:
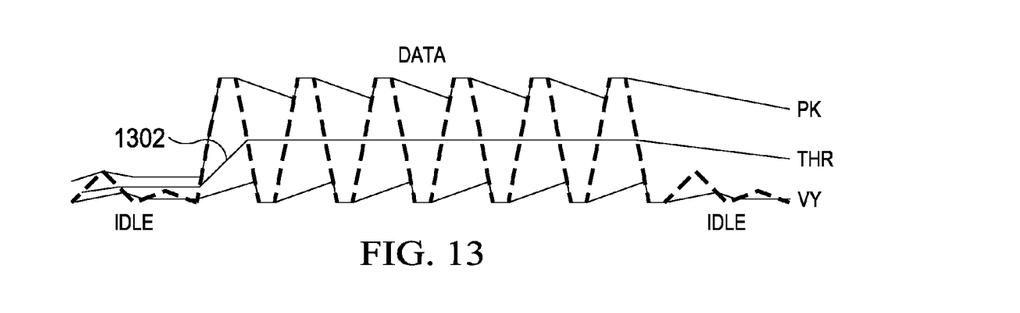
FIG. 13 shows the data output of the circuit of FIG. 12.

FIG. 13 shows the output of the comparator 1218. As can be seen, data is recovered between the two idle states. The signal PK represents the signal at the output of the peak detector 1202 after diode 1204 and the signal VY represents the signal at the output of valley detector 1214 after diode 1216. The threshold signal Thr is shown as rapidly increasing at 1302. It should be noted that when no data signal is present, the RC circuits are isolated by diodes 1204 and 1216 and the capacitors 1206 and 1210 will discharge to the idle level of the data through the resistors 1208 and 1212.

Figure 14:
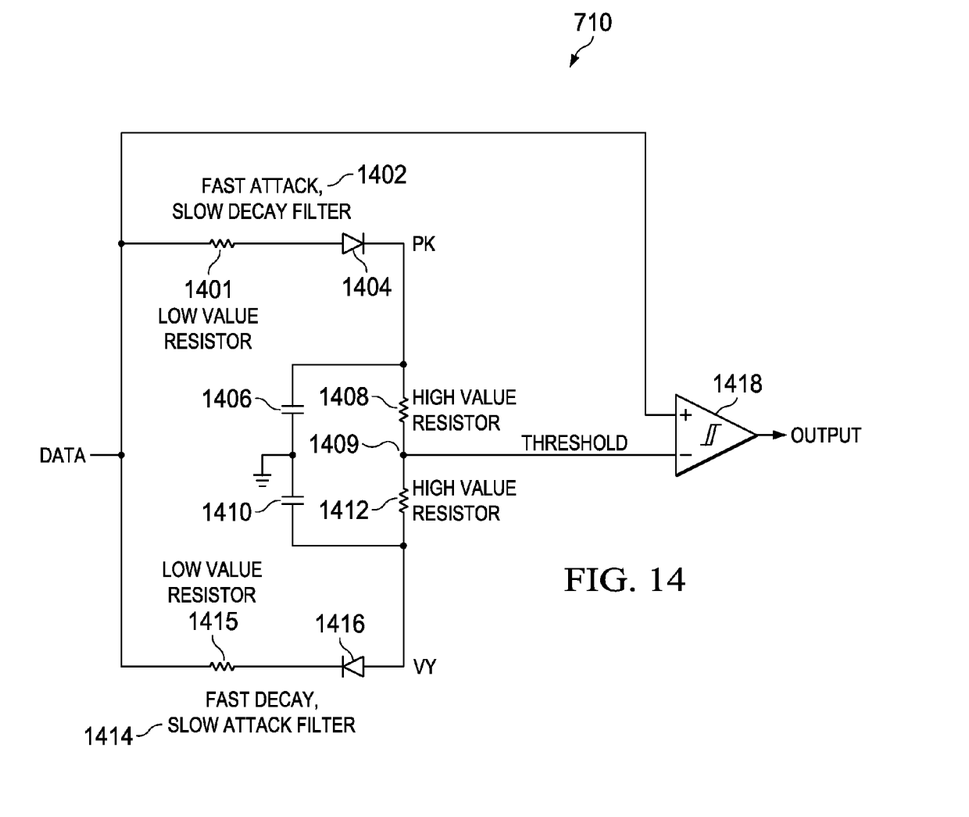
FIG. 14 shows an embodiment constructed according to the principles of the disclosure utilizing fast-attack slow-decay filters.

FIG. 14 shows another embodiment of the circuit 710. In FIG. 14, the amplifier 801 is replaced with a low value resistor 1401 having one end coupled to the data command stream and the other end coupled to a diode 1404. The data stream is also coupled via a low value resistor 1415, which replaces amplifier 815, to a diode 1416. The anode of diode 1404 is coupled via a high value resistor to a node 1409. A capacitor 1406 is coupled between the junction of the anode of diode 1404 and high value resistor 1408 and ground. A high value resistor 1412 is coupled between the cathode of diode 1416 and node 1409. A capacitor 1410 is coupled between the node formed by the cathode of diode 1416 and the high value resistor 1412 and ground.

In this embodiment, the circuit 710 is constructed using fast-attack, slow-decay filters. In FIG. 14, the fast-attack, slow-decay filter circuit is shown in detail. The data or command signal stream is coupled to RC filters with different time constants for rising and falling signals. Each RC filter consists of a lower value resistor, a higher value resistor, a capacitor and a blocking element. The blocking element allows higher current flow in one direction than the other and can be a diode, such as diodes 1404 and 1416.

In operation, the fast attack, slow decay filter 1402 output rises close to the high level of the data or command signal. Similarly, a fast decay, slow-attack filter 1414 output falls close to the low level of the data or command signal. When the signal returns to idle, the output of the fast-attack, slow-decay filter slowly decays to the idle level and the output of the fast-decay, slow-attack filter slowly rises to the level of the data or command signal. In this circuit, the high-value resistors serve two functions. One function is to create a threshold signal from the output of the fast-attack, slow-decay filter and the output of the fast-decay, slow-attack filter. The other function is to slowly change the output of the filters so that they are slowly returned to the idle level of the data or command signal.

Although the invention has been described in detail, it should be understood that various changes, substitutions and alterations can be made thereto without departing from the spirit and scope of the invention as defined by the appended claims. For example, the circuit can be applied to recover data from other noisy signals, and not just in wireless power systems.

The invention claimed is:

1. A circuit extracting data from a signal stream comprising:
a data stream terminal for receiving the signal stream;
a peak detector having an input coupled to the data stream terminal and an output;
a valley detector having an input coupled to the data stream terminal and an output coupled to the output of the peak detector at a node;
a pre-amplifier having an input coupled to the node, an input connected to the data stream terminal, and an output; and
a data comparator having a first input connected to the node, a second input connected to the output of the pre-amplifier, and a data output.

2. The circuit of claim 1 including:
a first RC circuit coupled to the output of the peak detector and the node; and
a second RC circuit coupled to the output of the valley detector and the node.

3. The circuit of claim 1 including:
a first capacitor coupled between the output of the peak detector and ground and a first resistor coupled between the output of the peak detector and the node; and
a second capacitor coupled between the output of the peak detector and ground and a second resistor coupled between the output of the peak detector and the node, wherein a signal at the node is a threshold level signal.

4. The circuit of claim 1 in which:
the peak detector is a first low value resistor having a first end connected to the data stream terminal and a second end, and including a first diode and a first high value resistor connected in series between the a second end and the node, and a first capacitor connected to between the first diode and first high value resistor and a ground; and
the valley detector is a second low value resistor having a third end connected to the data stream terminal and a fourth end, and including a second diode and a second high value resistor connected in series between the fourth end and the node, and a second capacitor connected to between the second diode and second high value resistor and the ground.

5. The circuit of claim 1 in which:
the peak detector is a first comparator having a first input connected to the data stream terminal, a peak output, and a second input coupled to the peak output, and including a first diode and a first resistor connected in series between the a peak output and the node, and a first capacitor connected to between the first diode and first resistor and a ground; and
the valley detector is a second comparator having a third input connected to the data stream terminal, a valley output, and a fourth input coupled to the valley output, and including a second diode and a second resistor connected in series between the valley output and the node, and a second capacitor connected to between the second diode and second resistor and the ground.

6. A method of extracting data from a signal stream comprising:
peak detecting the signal stream to generate a first signal;
valley detecting the signal stream to generate a second signal;
combining the first and second signals to generate a threshold signal;
receiving the signal stream at a first input terminal of a preamplifier;
coupling a second input terminal of the preamplifier to the threshold signal; and
comparing the output of the preamplifier to the threshold signal to extract data from the signal stream.

7. The method of claim 6 including:
coupling a first RC filter to the first signal and a node;
coupling a second RC filter to the second signal and the node; and
combining the first and second signals at the node to generate the threshold level signal.

8. In a primary side wireless power transmitter for being inductively coupled to a secondary side wireless power receiver for supplying power to the wireless power receiver to power a load coupled to the wireless power receiver, a primary side controller receiving communications from the secondary side wireless power receiver through the inductive coupling, comprising:
a peak detector receiving a signal stream from the secondary side wireless power receiver and having a peak output coupled to a node;
a valley detector receiving a signal stream from the secondary side wireless power receiver and having a valley output coupled to the node;
a pre-amplifier having an input coupled to the node, an input connected to the signal stream, and an output; and
a comparator having a first input coupled to the node, a second input coupled to the output of the pre-amplifier, and a data output.

9. The controller of claim 8 including:
a first RC circuit coupled to the peak output of the peak detector; and
a second RC circuit coupled to the valley output of the valley detector.

10. The controller of claim 8 in which:
the peak detector is a first low value resistor having a first end connected to the signal stream and a second end, and including a first diode and a first high value resistor connected in series between the a second end and the node, and a first capacitor connected to between the first diode and first high value resistor and a ground; and
the valley detector is a second low value resistor having a third end connected to the signal stream and a fourth end, and including a second diode and a second high value resistor connected in series between the fourth end and the node, and a second capacitor connected to between the second diode and second high value resistor and the ground.

11. The controller of claim 8 in which:
the peak detector is a first comparator having a first input connected to the signal stream, the peak output, and a second input coupled to the peak output, and including a first diode and a first resistor connected in series between the a peak output and the node, and a first capacitor connected to between the first diode and first resistor and a ground; and
the valley detector is a second comparator having a third input connected to the signal stream, the valley output, and a fourth input coupled to the valley output, and including a second diode and a second resistor connected in series between the valley output and the node, and a second capacitor connected to between the second diode and second resistor and the ground.

12. A method of operating a primary side wireless power transmitter inductively coupled to a secondary side wireless power receiver for supplying power to the wireless power receiver to power a load coupled to the receiver comprising:
peak detecting a signal stream from the wireless power receiver to generate a first signal;
valley detecting the signal stream to generate a second signal;
generating a threshold voltage signal from the first and second signals;
receiving the signal stream at a first terminal of a preamplifier;
coupling a second terminal of the preamplifier to the threshold voltage signal; and
comparing the output of the preamplifier to the threshold signal to extract data from the signal stream.

13. The method of claim 12 including:
coupling a first RC filter to the first signal and a node;
coupling a second RC filter to the second signal and the node; and
combining the first and second signals at the node to generate the threshold level signal.

* * * * *